A. PETER
Nov. 26, 1929. METER REGULATING DEVICE Re. 17,501
Original Filed Feb. 27, 1925
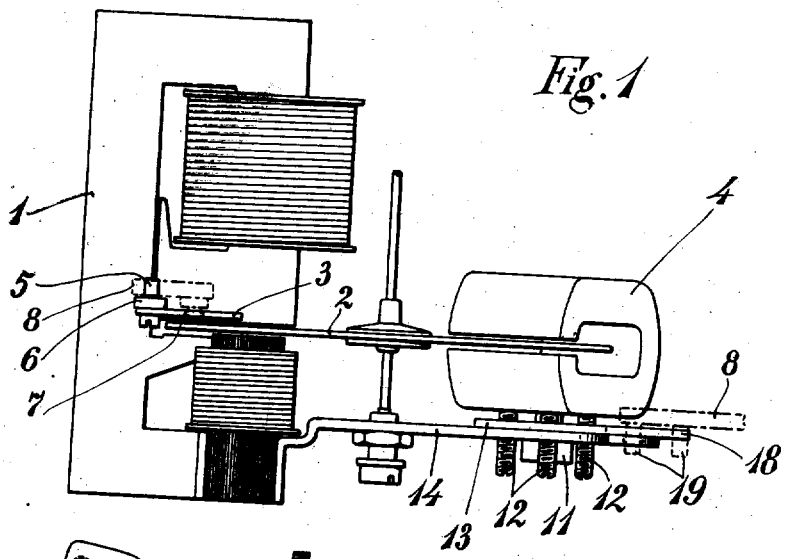
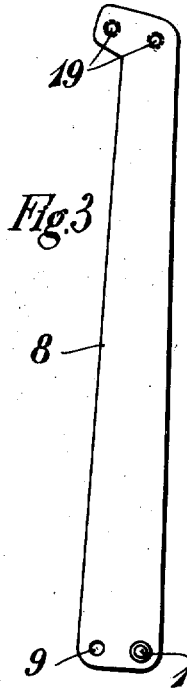
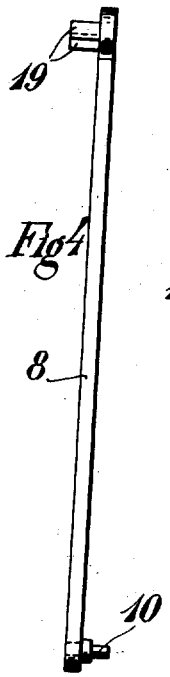
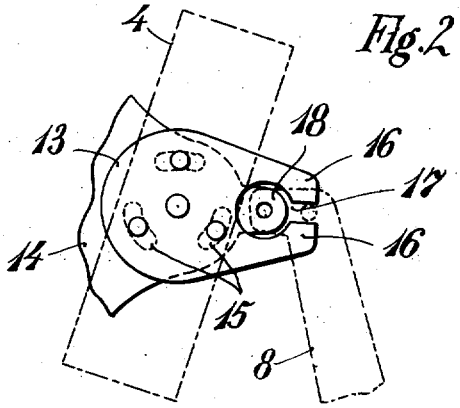
Inventor
Adolf Peter
By
B. Singer, Atty.

Reissued Nov. 26, 1929 Re. 17,501

UNITED STATES PATENT OFFICE

ADOLF PETER, OF ZUG, SWITZERLAND, ASSIGNOR TO LANDIS & GYR S. A., OF ZUG, SWITZERLAND, A FIRM OF SWITZERLAND

METER-REGULATING DEVICE

Original No. 1,708,894, dated April 9, 1929, Serial No. 12,187, filed February 27, 1925, and in Switzerland March 8, 1924. Application for reissue filed September 10, 1929. Serial No. 391,617.

My invention relates to a new and improved device to adjust the position of those elements of an electricity meter by which the speed of the driving disc may be regulated.

The main object of the invention is to provide a device which allows a quick and exact adjustment of the said parts. I attain this object by means of a lever having means to engage simultaneously a stationary part of the meter and a movable part to be adjusted for the purpose said above in such a manner that by moving the said lever the movable part is set to such a position as to influence the disc of the meter in the desired manner.

In the accompanying drawing one form of construction is shown by way of an example.

Fig. 1 shows in a side view part of an electricity meter of the Ferraris type having a rotary disc and a brake magnet.

Fig. 2 shows the brake magnet and its support seen from above.

Figs. 3 and 4 are respectively plan view and side view of the setting lever.

In the drawing 1 denotes the iron core on which the current and the pressure coils are mounted in the well known manner, 2 is the disc mounted on a vertical spindle, 3 is the starting control plate, and 4 is the braking magnet.

The starting control plate 3 is fastened to a lug 6 of the iron core 1 by means of a screw 5; it is provided with a hole 7. The screw 5 projects above the lug 6 and serves as a pivot for the tool 8. The said tool is provided with a bore 9 and a pin 10 near one of its ends, said bore 9 being adapted to receive the screw 5, and said pin 10 being adapted to engage the opening 7 of the plate 3. If the tool engages the screw 5 in the stationary part 6, with pin 10 in the plate 3 as shown in broken lines Fig. 1, the latter may be turned round the screw 5 to any desired position. The screw 5 may be loosened to facilitate the adjusting of plate 3 and is drawn tight after the adjustment has taken place.

The brake magnet is connected to a support 14 by a screw 11 and rests on three screws 12 screwed into a plate 13 which rests on the support 14. Hence by means of the screw 11 and screws 12 the brake magnet may be adjusted vertically with reference to the disc of the meter. The screws 12 project through curved slots 15 of the support 14 and the screw 11 is revoluble in a centre bore of the plate 13. The plate 13 is provided with a lateral projection 16 having a slot 17, two edges of which are parallel to each other and at an enlarged circular portion of slot 17.

It will be understood from the foregoing that the disc 13 rests upon support 14 and is rotatable on the screw 11, which is guided in an opening of the support 14 and is screwed into the magnet 4.

The tool 8 has one of its ends bent-off and at this bent-off portion two pins 19 are fastened one adapted to engage the bore of stud 18 on support 14 while the other pin 19 engages slot 17 between the parallel edges as shown in broken lines (Fig. 2). By turning the tool around the pin 19 engaging the bore in the stationary support 14 the second pin 19 abutting on one of the edges of slot 17 rotates the plate 13 and therewith the brake magnet around screw 11. The long leverage afforded by the tool 8 allows an easy and exact adjustment.

It will be understood that primarily the magnet 4 can be rotated with the disc 13 around the screw 11, and that the magnet can also be adjusted in its angular position with regard to the driving disc without influencing the adjustment of the magnet in regard to the position of its slot in respect to the driving disc 2. Moreover, the magnet can be adjusted in its height with respect to the driving disc, for instance by loosening the screws 12 and tightening the screw 11, so that the slot of the magnet is positioned lower with respect to the driving disc. Also the screw 11 can first be loosened a little and thereupon the screws 12 tightened so that the slot of the magnet is positioned higher with respect to the driving disc.

The shape of the tool 8 especially the bent-off portion with the pins 19 allows the tool to turn the plate 13 through a considerable range of movement in those meters where the base plate is provided with side walls.

What I claim is:

1. In adjunctive equipment for adjusting the position of the brake magnets of an induction meter with respect to the meter disc, co-operating mounting bracket and adjusting tool means consisting of a plate arranged on the bracket, a screw extending through the bracket, through said plate and into the brake magnet, and hence pivotally securing the brake magnet and enabling the same to be also vertically adjusted, adjusting screws extending through the plate and bearing under the magnet, said bracket having slots in which said adjusting screws may travel when the magnet is pivotally turned, and said bracket and said plate having means for the reception of members of a tool forming a lever whereby the plate and hence also the magnet may be turned.

2. In an induction meter, the combination of a magnet supporting bracket, a brake magnet pivotally mounted on the bracket by a screw, a plate mounted on the bracket by means of the magnet-mounting screw and a plurality of adjusting screws mounted on the plate and pressing against the magnet, thereby permitting adjustment of the magnet in all directions.

3. In an induction meter, the combination of a bracket having a plurality of curved slots, a brake magnet pivotally mounted on said bracket by a screw, a plate mounted on the bracket by means of the magnet-mounting screw, and a plurality of adjusting screws threaded in the plate, pressing against the magnet and projecting through the slots in the bracket, thereby permitting adjustment of the magnet in all directions.

ADOLF PETER.